United States Patent
Liu et al.

(10) Patent No.: US 12,445,133 B2
(45) Date of Patent: Oct. 14, 2025

(54) CONTROL CIRCUIT, METHOD AND SYSTEM

(71) Applicant: Nuvoton Technology Corporation, Hsinchu Science Park (TW)

(72) Inventors: Tse-Yen Liu, Taipei (TW); Yu-Jen Chang, Yuanlin (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 97 days.

(21) Appl. No.: 18/072,867

(22) Filed: Dec. 1, 2022

(65) Prior Publication Data
US 2023/0216504 A1  Jul. 6, 2023

(30) Foreign Application Priority Data

Dec. 30, 2021  (TW) .................. 110149591

(51) Int. Cl.
*H03K 19/17* (2006.01)
*H03K 19/17736* (2020.01)
*H03K 19/17788* (2020.01)
*H03K 19/20* (2006.01)

(52) U.S. Cl.
CPC ......... *H03K 19/20* (2013.01); *H03K 19/1774* (2013.01); *H03K 19/17788* (2013.01)

(58) Field of Classification Search
CPC ............... H03K 19/20; H03K 19/1774; H03K 19/17788
See application file for complete search history.

(56) References Cited

U.S. PATENT DOCUMENTS

| 4,599,600 | A | 7/1986 | McGuire et al. |
| 5,727,006 | A | 3/1998 | Dreyer et al. |
| 9,083,368 | B2 | 7/2015 | Kim et al. |
| 2005/0275568 | A1* | 12/2005 | Madni .................. G01D 5/2053 341/50 |
| 2007/0257512 | A1* | 11/2007 | Anderson ............... B62D 35/00 296/180.1 |
| 2009/0195682 | A1 | 8/2009 | Koh et al. |
| 2011/0292109 | A1* | 12/2011 | Fosas ................... B41J 2/04581 347/11 |
| 2016/0320205 | A1* | 11/2016 | Li ........................... H02P 31/00 |

FOREIGN PATENT DOCUMENTS

| CN | 102594335 A | 7/2012 |
| CN | 111399588 B | 9/2021 |

* cited by examiner

*Primary Examiner* — Sibin Chen
(74) *Attorney, Agent, or Firm* — MUNCY, GEISSLER, OLDS & LOWE, P.C.

(57) ABSTRACT

A control circuit including a quadrature encoder circuit, a counter circuit, and a cutoff circuit is provided. The quadrature encoder circuit generates a first edge signal and a first direction signal according to a first external signal and a second external signal. The counter circuit performs a counting operation according to the first edge signal and the first direction signal. In response to the timer signal being enabled, the cutoff circuit prevents the first edge signal and the first direction signal from entering the counter circuit and provides a second edge signal and a second direction signal to the counter circuit so that the counter circuit performs the counting operation according to the second edge signal and the second direction signal.

15 Claims, 7 Drawing Sheets

CONTROL CIRCUIT, METHOD AND SYSTEM

CROSS REFERENCE TO RELATED APPLICATIONS

This Application claims priority of Taiwan Patent Application No. 110149591, filed on Dec. 30, 2021, the entirety of which is incorporated by reference herein.

BACKGROUND OF THE INVENTION

Field of the Invention

The invention relates to a control circuit, and more particularly to a control circuit that has a quadrature mode or a timer mode.

Description of the Related Art

The functions of micro-controller units (MCU) have increased as the technology has developed. For example, an MCU may have a quadrature decoder function to decode signals from a quadrature encoder interface (QEI). However, when the MCU does not receive any signals from the QEI, some elements in the MCU remain idle.

BRIEF SUMMARY OF THE INVENTION

In accordance with an embodiment, a control circuit comprises a quadrature encoder circuit, a counter circuit, and a cutoff circuit. The quadrature encoder circuit generates a first edge signal and a first direction signal according to a first external signal and a second external signal. The counter circuit performs a counting operation according to the first edge signal and the first direction signal. In response to the timer signal being enabled, the cutoff circuit prevents the first edge signal and the first direction signal from entering the counter circuit and provides a second edge signal and a second direction signal to the counter circuit so that the counter circuit performs the counting operation according to the second edge signal and the second direction signal.

An exemplary embodiment of a control method is described in the following. A first external signal and a second external signal are processed to generate an edge signal and a direction signal. A determination is made as to whether a timer signal is enabled. In response to the timer signal not being enabled, a counting operation is performed according to the edge signal and the direction signal. In response to the timer signal being enabled, the counting operation is performed according to a system clock.

An exemplary embodiment of a control system controls the operation of a motor and comprises a quadrature encoder circuit, a counter circuit, a cutoff circuit, and a central processing unit. The quadrature encoder circuit generates a first edge signal and a first direction signal according to a first external signal and a second external signal. The counter circuit performs a counting operation according to the first edge signal and the first direction signal to adjust a count value. In response to a timer signal being enabled, the cutoff circuit prevents the first edge signal and the first direction signal from entering the counter circuit and provides a second edge signal and a second direction signal to the counter circuit so that the counter circuit performs the counting operation according to the second edge signal and the second direction signal. The central processing unit is coupled to the counter circuit. In response to the timer signal being enabled and the count value reaching a target value, the counter circuit sends an interrupt signal to interrupt the operation of the CPU.

Control methods may be practiced by the control circuit and the control system which have hardware or firmware capable of performing particular functions and may take the form of program code embodied in a tangible media. When the program code is loaded into and executed by an electronic device, a processor, a computer or a machine, the electronic device, the processor, the computer or the machine becomes the control circuit or the control system for practicing the disclosed method.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
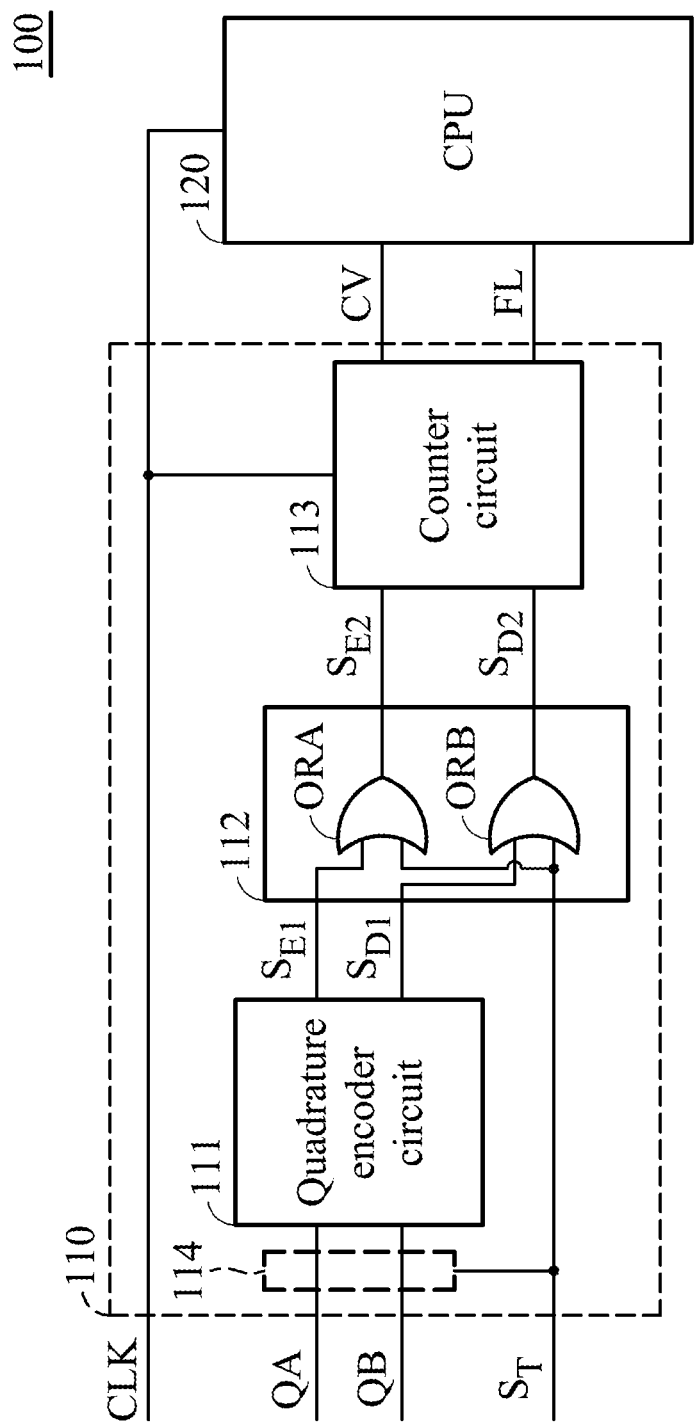
FIG. 1 is a schematic diagram of an exemplary embodiment of a control system in accordance with some embodiments.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of a control system in accordance with some embodiments. The control system 100 comprises a control circuit 110 and a central processing unit (CPU) 120. The control circuit 110 and the CPU 120 receive a system clock CLK. The CPU 120 operates according to the system clock CLK. In one embodiment, the system clock CLK is generated by a clock generator (not shown) disposed in the control system 100. The kind of control system 100 is not limited in the present disclosure. In one embodiment, the control system 100 is a microcontroller unit (MCU).

In this embodiment, the control circuit 110 may operate in a quadrature mode or a timer mode. In the quadrature mode, the control circuit 110 counts the transitions of the external signals QA and QB to adjust the count value CV. The external signals QA and QB may be provided by a sensing device. The sensing device generates the external signals QA and QB according to the rotation speed and the rotation direction of a motor. In the quadrature mode, the CPU 120 determines the operation state (e.g., a rotation speed and a rotation direction) of an external device (e.g., a motor) according to the count value CV. In other embodiments, when the control circuit 110 sends an interrupt signal FL, the CPU 120 may read the count value CV to determine whether an external device (not shown) is abnormal. In one embodiment, when the external device is abnormal, the CPU 120 may turn-off the external device.

In a timer mode, the control circuit 110 performs a counting operation according to the system clock CLK. In this mode, the control circuit 110 serves as a timer. When the duration for which the control circuit 110 performs the counting operation reaches a predetermined value, the control circuit 110 sends an interrupt signal FL to interrupt the operation of the CPU 120. The structure of the control circuit 110 is not limited in the present disclosure. In one embodiment, the control circuit 110 comprises a quadrature encoder circuit 111, a cutoff circuit 112, and a counter circuit 113.

The quadrature encoder circuit 111 generates an edge signal $S_{E1}$ and a direction signal $S_{D1}$ according to the external signals QA and QB. In one embodiment, the external signals QA and QB are provided by an external device outside of the control system 100. The structure of quadrature encoder circuit 111 is not limited in the present disclosure. The operation configuration of the quadrature encoder circuit 111 is described in greater detail with reference to FIG. 3. In this embodiment, when the control circuit 110 enters a quadrature mode, the quadrature encoder circuit 111 operates normally. When the control circuit 110 enters a timer mode, the quadrature encoder circuit 111 may operate continually or stop operating.

The cutoff circuit 112 generates an edge signal $S_{E2}$ and a direction signal $S_{D2}$ according to the edge signal $S_{E1}$, the direction signal $S_{D1}$, and a timer signal $S_T$. For example, when the timer signal $S_T$ is not enabled, it means that a timer function does not be enabled. Therefore, the cutoff circuit 112 directly uses the edge signal $S_{E1}$ as the edge signal $S_{E2}$ and uses the direction signal $S_{D1}$ as the direction signal $S_{D2}$. When the timer signal $S_T$ is enabled, it means that the timer function is enabled. Therefore, the cutoff circuit 112 ignores the edge signal $S_{E1}$ and the direction signal $S_{D1}$. In one embodiment, the cutoff circuit 112 sets the edge signal $S_{E2}$ and the direction signal $S_{D2}$ to a predetermined level, such as a high level. In other embodiments, when the timer signal $S_T$ is enabled, the cutoff circuit 112 uses the timer signal $S_T$ as the edge signal $S_{E2}$ and the direction signal $S_{D2}$.

The structure of cutoff circuit 112 is not limited in the present disclosure. In one embodiment, the cutoff circuit 112 is a multiplexer (not shown). When the timer signal $S_T$ is not enabled, the cutoff circuit 112 uses the edge signal $S_{E1}$ as the edge signal $S_{E2}$ and uses the direction signal $S_{D1}$ as the direction signal $S_{D2}$. When the timer signal $S_T$ is enabled, the cutoff circuit 112 uses the timer signal $S_T$ as both the edge signal $S_{E2}$ and the direction signal $S_{D2}$.

In this embodiment, the cutoff circuit 112 comprises OR gates ORA and ORB. The OR gate ORA generates the edge signal $S_{E2}$ according to the edge signal $S_{E1}$ and the timer signal $S_T$. For example, when the timer signal $S_T$ is enabled, the timer signal $S_T$ may be at a high level. The OR gate ORA uses the timer signal $S_T$ as the edge signal $S_{E2}$. When the timer signal $S_T$ is not enabled, the timer signal $S_T$ may be at a low level. Therefore, the OR gate ORA uses the edge signal $S_E$, as the edge signal $S_{E2}$. The OR gate ORB generates the direction signal $S_{D2}$ according to the direction signal $S_D$, and the timer signal $S_T$. For example, when the timer signal $S_T$ is enabled, the timer signal $S_T$ may be at a high level. Therefore, the OR gate ORB uses the timer signal $S_T$ as the direction signal $S_{D2}$. When the timer signal $S_T$ is not enabled, the timer signal $S_T$ may be at a low level. Therefore, the OR gate ORB uses the direction signal $S_{D1}$ as the direction signal $S_{D2}$.

The counter circuit 113 performs a counting operation according to the edge signal $S_{E2}$ and the direction signal $S_{D2}$ to adjust the count value CV. In this embodiment, when the timer signal $S_T$ is not enabled, since the cutoff circuit 112 uses the edge signal $S_{E1}$ as the edge signal $S_L$ and uses the direction signal $S_D$) as the direction signal $S_{D2}$, the counter circuit 113 adjusts the count value CV according to the edge signal $S_{E1}$ and the direction signal $S_{D1}$. In one embodiment, the counter circuit 113 changes the count value CV according to the edge signal $S_E$, and increases or decreases the count value CV according to the direction signal $S_{D1}$.

For example, when each of the voltage levels of the edge signal $S_E$, and the direction signal $S_{D1}$ is equal to a specific level (e.g., a high level), the counter circuit 113 increases the count value CV. When the voltage level of the edge signal $S_{E1}$ is equal to the specific level and the voltage level of the direction signal SDI is not equal to the specific level, the counter circuit 113 decreases the count value CV. When the voltage of the edge signal $S_{E1}$ is not equal to the specific level, even if the voltage level of the direction signal $S_{D1}$ is equal to the specific level, the counter circuit 113 stops adjusting the count value CV.

In other embodiments, when the timer signal $S_T$ is enabled, since the cutoff circuit 112 sets each of the edge signal $S_{E2}$ and the direction signal $S_{D2}$ to a fixed level, the counter circuit 113 adjusts the count value CV according to the system clock CLK. When the count value CV arrives at a target value, the counter circuit 113 sends the interrupt signal FL to interrupt the operation of the CPU 120. In one embodiment, the target value is stored in a compared value register.

In some embodiments, the control circuit 110 further comprises a cutoff circuit 114. The cutoff circuit 114 receives the external signals QA and QB. When the timer signal $S_T$ is not enabled, the cutoff circuit 114 transforms the external signals QA and QB to the quadrature encoder circuit 111. When the timer signal $S_T$ is enabled, the cutoff circuit 114 prevents the external signals QA and QB from entering the quadrature encoder circuit 111. At this time, the quadrature encoder circuit 111 may set each of the edge signal $S_{E1}$ and the direction signal $S_{D1}$ to a fixed level, such as a high level. In this case, the edge signal $S_{E1}$ serves as the edge signal $S_{E2}$, and the direction signal $S_{D1}$ serves as the direction signal $S_{D2}$. Therefore, the cutoff circuit 112 can be omitted.

Figure 2:
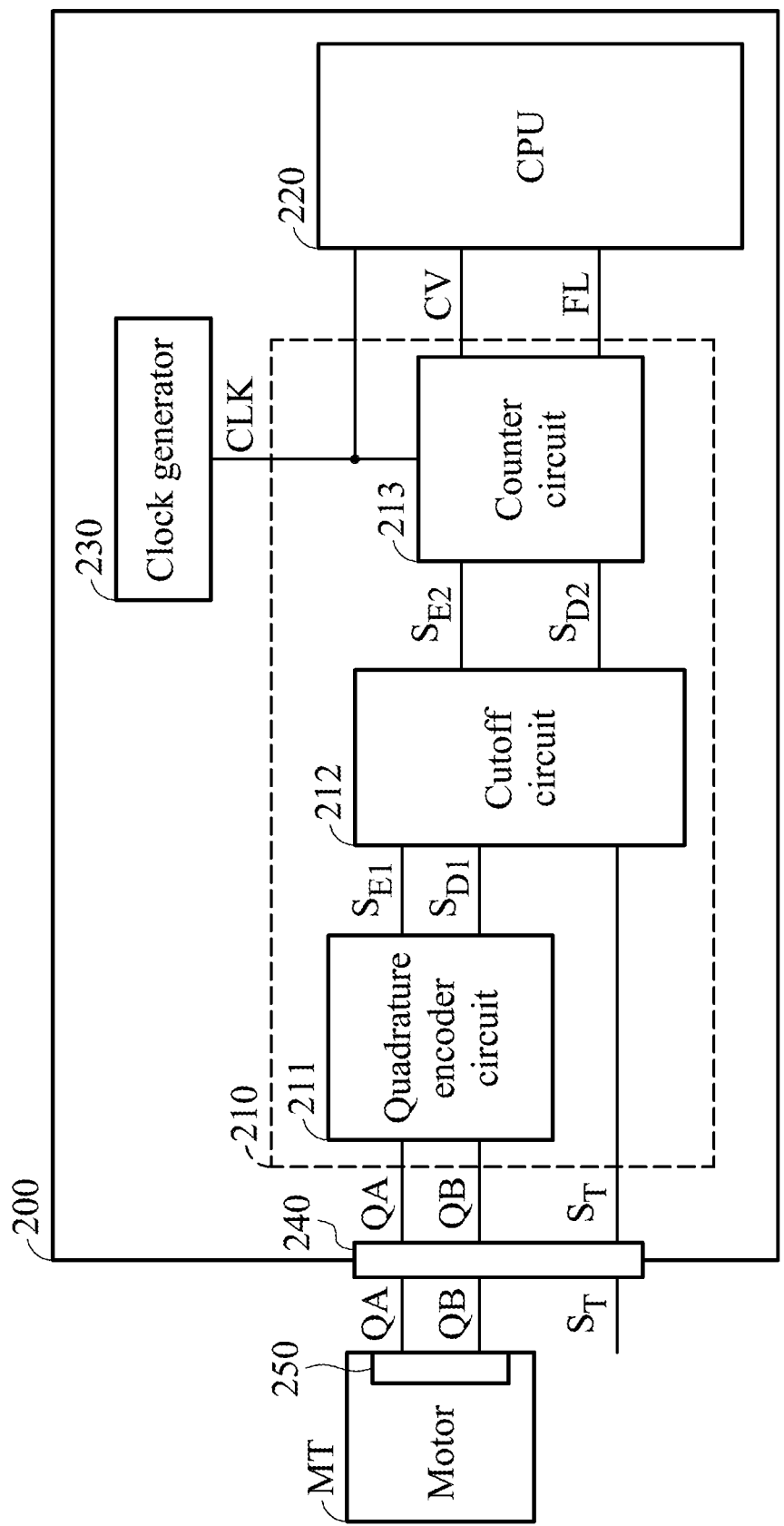
FIG. 2 is a schematic diagram of another exemplary embodiment of the control system in accordance with some embodiments.

FIG. 2 is a schematic diagram of another exemplary embodiment of the control system in accordance with some embodiments. In this embodiment, the control system 200 is configured to control the operation of the motor MT. A sensing circuit 250 is disposed in the motor MT. The sensing circuit 250 detects the operation of the motor MT to generate a detection result and performs a quadrature encoder operation for the detection result to provide the external signals QA and QB. In one embodiment, the sensing circuit 250 comprises a quadrature encoder interface (QEI) to output the external signals QA and QB.

The control system 200 comprises a control circuit 210, a CPU 220, a clock generator 230 and an input-output interface 240. Since the features of the control circuit 210 and the CPU 220 are the same as the feature of the control circuit 110 and the CPU 120 of FIG. 1, the descriptions of the control circuit 210 and the CPU 220 are omitted.

The clock generator 230 is configured to generate the system clock CLK and provide the system clock CLK to the counter circuit 213 and the CPU 220. In other embodiments, the quadrature encoder circuit 211 also receives the system clock CLK. In this embodiment, the input-output interface 240 is configured to receive the external signals QA and QB and the timer signal $S_T$. In one embodiment, the input-output interface 240 comprises a plurality of general-purpose input-output (GPIO) pins.

When the timer signal $S_T$ is not enabled, the control circuit 210 operates in a quadrature mode. The CPU 220 determines the operation of the motor MT according to the count value CV. At this time, when the control circuit 210 sends an interrupt signal FL, it means that the motor MT is abnormal. Therefore, the CPU 220 may direct an external power supply (not shown) to stop providing power to the motor MT.

When the timer signal $S_T$ is enabled, the control circuit 210 operates in a timer mode. In this mode, the control circuit 210 ignores the external signals QA and QB. The control circuit 210 performs a counting operation according to the system clock CLK. At this time, the control circuit 210 serves as a timer. The count value CV is not interfered by the transitions of the external signals QA and QB.

Figure 3:
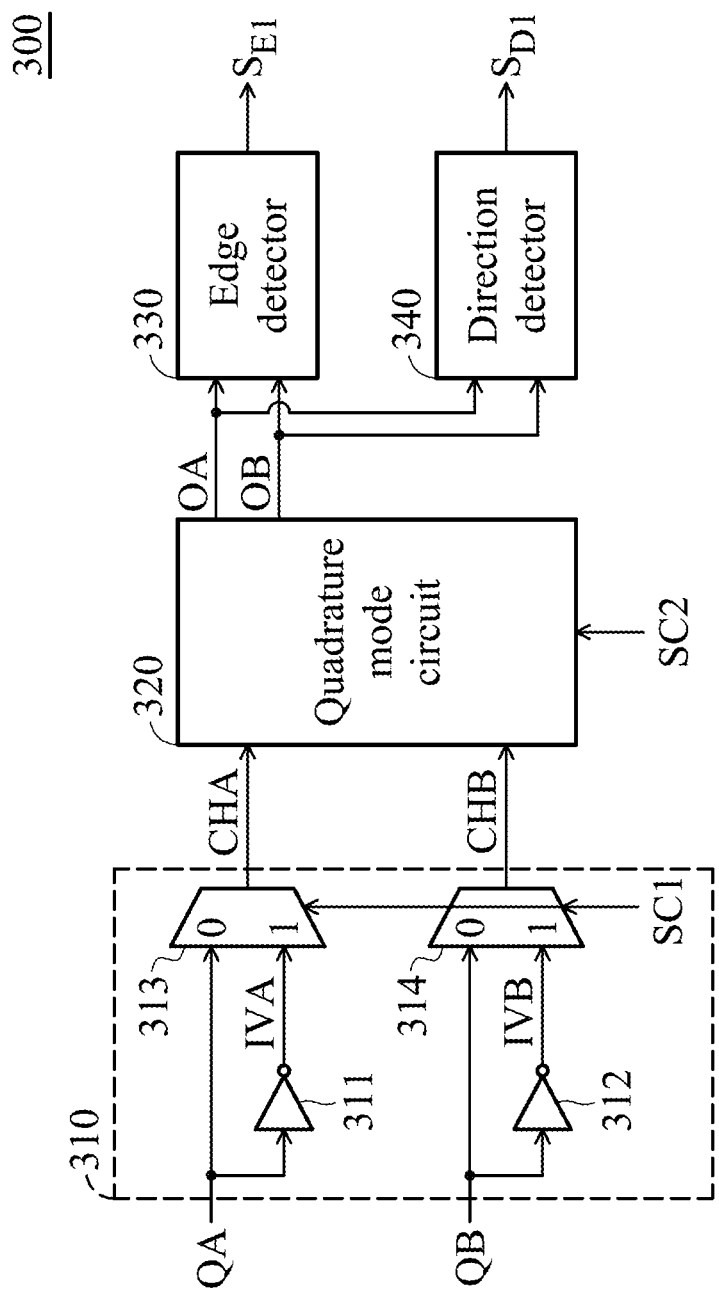
FIG. 3 is a schematic diagram of an exemplary embodiment of a quadrature encoder circuit in accordance with some embodiments.

FIG. 3 is a schematic diagram of an exemplary embodiment of a quadrature encoder circuit in accordance with some embodiments. The quadrature encoder circuit 300 comprises a process circuit 310, a quadrature mode circuit 320, an edge detector 330 and a direction detector 340. The structure of quadrature encoder circuit 300 is not limited in the present disclosure. Any circuit can serve as the quadrature encoder circuit 300, as long as the circuit is capable of performing a counting operation according to the transitions of the external signals QA and QB.

The process circuit 310 receives the external signals QA and QB and generates output signals CHA and CHB according to a control signal SC1. For example, when the control signal SC1 is at a low level, the process circuit 310 directly uses the external signal QA as the output signal CHA and uses the external signal QB as the output signal CHB. When the control signal SC1 is at a high level, the process circuit 310 inverts the external signal QA to generate the inverted signal IVA and inverts the external signal QB to generate the inverted signal IVB. The process circuit 310 uses the inverted signal IVA as the output signal CHA and uses the inverted signal IVB as the output signal CHB.

In this embodiment, the process circuit 310 comprises inverters 311 and 312, and multiplexers 313 and 314. The inverter 311 inverts the external signal QA to generate the inverted signal IVA. The inverter 312 inverts the external signal QB to generate the inverted signal VB. The multiplexer 313 receives the external signal QA and the inverted signal IVA. The multiplexer 313 uses the external signal QA or the inverted signal IVA as the output signal CHA according to the control signal SCL. The multiplexer 314 receives the external signal QB and the inverted signal IVB. The multiplexer 314 uses the external signal QB or the inverted signal IVB as the output signal CHB according to the control signal SC1.

The quadrature mode circuit 320 receives the output signals CHA and CHB and generates output signals OA and OB according to a control signal SC2. For example, when the control signal SC2 is not enabled, for example, the control signal SC2 is at a low level, the quadrature mode circuit 320 uses the output signal CHA as the output signal OA and uses the output signal CHB as the output signal OB. When the control signal SC2 is enabled, for example, the control signal SC2 is at a high level, the quadrature mode circuit 320 uses the output signal CHA as the output signal OB and uses the output signal CHB as the output signal OA. In some embodiments, the quadrature mode circuit 320 is referred to as a switching circuit.

The edge detector 330 detects the edges of the output signals OA and OB to generate the edge signal $S_{E1}$. The structure of edge detector 330 is not limited in the present disclosure. Any circuit can serve as the edge detector 330, as long as the circuit is capable of detecting the edge of a signal.

The direction detector 340 generates the direction signal $S_{D1}$ according to the output signals OA and OB. In one embodiment, when the output signal OA leads the output signal OB, the direction signal $S_{D1}$ is at a specific level, such as a high level. When the output signal OA lags the output signal OB, the direction signal $S_{D1}$ is not at the specific level. The structure of direction detector 340 is not limited in the present disclosure. Any circuit can serve as the direction detector 340, as long as the circuit is capable of determining whether the output signal OA leads the output signal OB.

Figure 4:
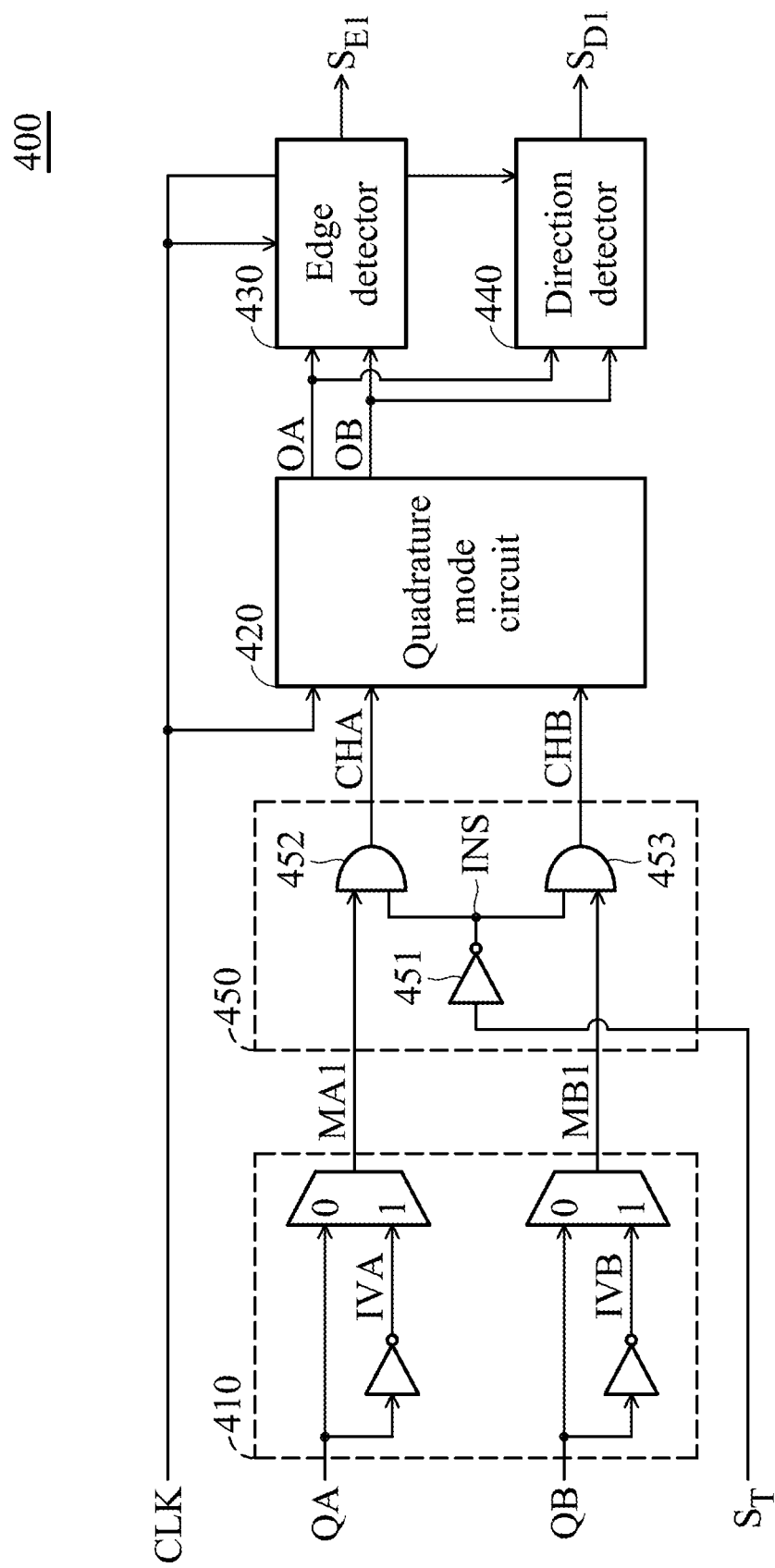
FIG. 4 is a schematic diagram of another exemplary embodiment of the quadrature encoder circuit in accordance with some embodiments.

FIG. 4 is a schematic diagram of another exemplary embodiment of the quadrature encoder circuit in accordance with some embodiments. FIG. 4 is similar to FIG. 3 with the exception that the quadrature encoder circuit 400 further comprises a cutoff circuit 450. Since the features of the process circuit 410, the quadrature mode circuit 420, the edge detector 430, and the direction detector 440 in FIG. 4 are the same as the features of the process circuit 310, the quadrature mode circuit 320, the edge detector 330, and the direction detector 340, the descriptions of the features of the process circuit 410, the quadrature mode circuit 420, the edge detector 430 and the direction detector 440 are omitted.

The cutoff circuit 450 is coupled between the process circuit 410 and the quadrature mode circuit 420 to prevent the output signals MA1 and MB1 of the process circuit 410 from entering the quadrature mode circuit 420. For example, when the timer signal $S_T$ is not enabled (e.g., the timer signal S-r is at a low level), the cutoff circuit 450 uses the output signal MA1 as the output signal CHA and uses the output signal MB1 as the output signal CHB. When the timer signal $S_T$ is enabled (e.g., the timer signal $S_T$ is at a high level), the cutoff circuit 450 sets each of the output signals CHA and CHB at a predetermined level, such as a low level.

The structure of cutoff circuit 450 is not limited in the present disclosure. Any circuit can serve as the cutoff circuit 450, as long as the circuit is capable of preventing the output signals MA1 and MB1 from entering the quadrature mode circuit 420. In this embodiment, the cutoff circuit 450 comprises an inverter 451, and AND gates 452 AND 453. The inverter 451 inverts the timer signal $S_T$ to generate an inverted signal INS.

The AND gate 452 receives the output signal MA1 and the inverted signal INS. When the timer signal $S_T$ is not enabled, the AND gate 452 uses the output signal MA1 as the output signal CHA. When the timer signal $S_T$ is enabled, the AND gate 452 uses the inverted signal INS as the output signal CHA. The AND gate 453 receives the output signal MB1 and the inverted signal INS. When the timer signal $S_T$ is not enabled, the AND gate 453 uses the output signal MB1 as the output signal CHB. When the timer signal $S_T$ is enabled, the AND gate 453 uses the inverted signal INS as the output signal CHG.

In some embodiments, the quadrature mode circuit 420, the edge detector 430, and the direction detector 440 operate according to the system clock CLK. For example, the quadrature mode circuit 420 generates the output signals OA and OB according to the system clock CLK. The edge detector 430 detects the edges of the output signals OA and OB according to the system clock CLK. The direction detector 440 determines whether the output signal OA leads the output signal OB according to the system clock CLK.

Figure 5:
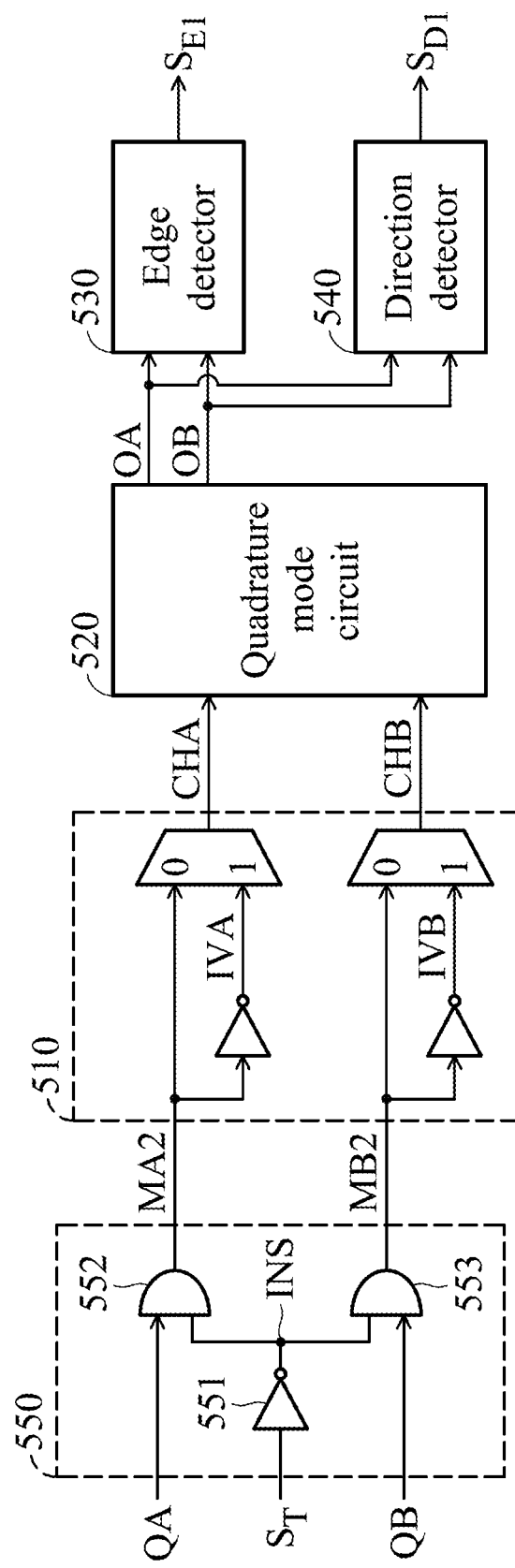
FIG. 5 is a schematic diagram of another exemplary embodiment of the quadrature encoder circuit in accordance with some embodiments.

FIG. 5 is a schematic diagram of another exemplary embodiment of the quadrature encoder circuit in accordance with some embodiments. FIG. 5 is similar to FIG. 3 with the exception that the quadrature encoder circuit 500 further comprises a cutoff circuit 550. Since the features of the process circuit 510, the quadrature mode circuit 520, the edge detector 530, and the direction detector 540 in FIG. 5 are the same as the features of the process circuit 310, the quadrature mode circuit 320, the edge detector 330, and the direction detector 340 in FIG. 3, the descriptions of the features of the process circuit 510, the quadrature mode circuit 520, the edge detector 530, and the direction detector 540 are omitted.

The cutoff circuit 550 is coupled to the process circuit 510 to prevent the external signals QA and QB from entering the process circuit 510. The structure of cutoff circuit 550 is not limited in the present disclosure. Any circuit can serve as the cutoff circuit 550, as long as the circuit is capable of preventing the external signals QA and QB from entering the process circuit 510. In this embodiment, the cutoff circuit 550 comprises an inverter 551, and AND gates 552 and 553. The inverter 551 inverts the timer signal $S_T$ to generate the inverted signal INS.

The AND gate 552 receives the external signal QA and the inverted signal INS. When the timer signal $S_T$ is not enabled, the AND gate 552 uses the external signal QA as the output signal MA2. When the timer signal $S_T$ is enabled, the AND gate 552 uses the inverted signal INS as the output signal MA2. The AND gate 55 receives the external signal QB and the inverted signal INS. When the timer signal $S_T$ is not enabled, the AND gate 553 uses the external signal QB as the output signal MB2. When the timer signal S r is enabled, the AND gate 553 uses the inverted signal INS as the output signal MB2.

Figure 6A:
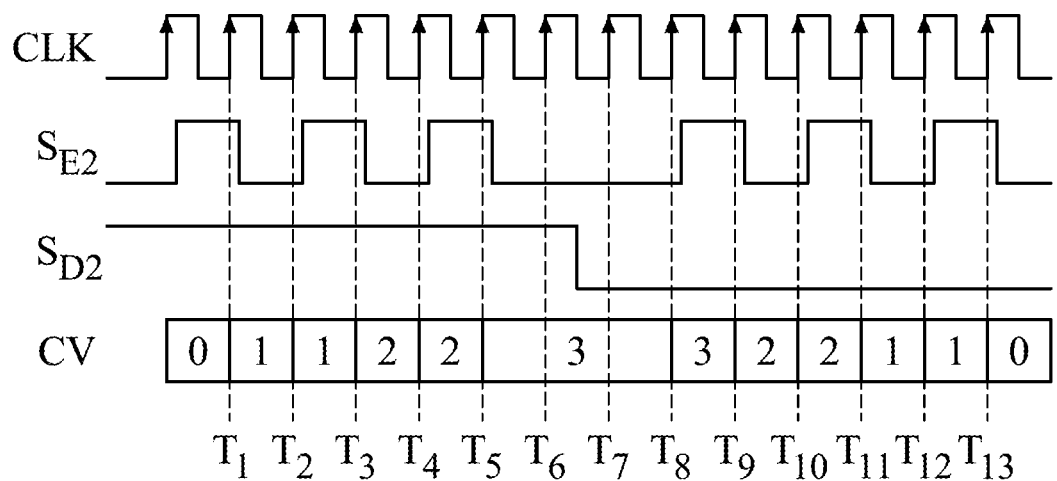
FIG. 6A is an operation schematic diagram of an exemplary embodiment of the control system entering a quadrature mode in accordance with some embodiments.

FIG. 6A is an operation schematic diagram of an exemplary embodiment of the control system entering a quadrature mode in accordance with some embodiments. When the timer signal $S_T$ is not enabled, the control circuit 110 enters a quadrature mode. In the quadrature mode, the control circuit 110 adjusts the count value CV according to the external signals QA and QB. Taking FIG. 1 as an example, the quadrature encoder circuit 111 generates the edge signal $S_{E1}$, and the direction signal $S_{D1}$ according to the external signals QA and QB. The cutoff circuit 112 uses the edge signal $S_{E1}$, as the edge signal $S_{E2}$ and uses the direction signal $S_{D1}$ as the direction signal $S_{D2}$. The counter circuit 113 adjusts the count value CV according to the edge signal $S_{E2}$ and the direction signal $S_{D2}$.

At the time point $T_1$, the voltage level of the system clock CLK is changed from a low level to a high level. At this time, each of the edge signal $S_{E2}$ and the direction signal $S_{D2}$ is at the high level. Therefore, the counter circuit 113 increases the count value CV from the value 0 to the value 1. At the time point $T_2$, the voltage level of the system clock CLK is re-changed from a low level to a high level. At this time, the edge signal $S_{E2}$ is at a low level, and the direction signal $S_{D2}$ is at the high level. Therefore, the counter circuit 113 stops adjusting the count value CV. In this case, the count value CV maintains at the value 1.

At the time point $T_3$, the voltage level of the system clock CLK is changed from the low level to the high level. At this time, each of the edge signal $S_{E2}$ and the direction signal $S_{D2}$ is at the high level. Therefore, the counter circuit 113 increases the count value CV from the value 1 to the value 2. At the time point $T_4$, the voltage level of the system clock CLK is re-changed from the low level to the high level. At this time, the edge signal $S_{E2}$ is at the low level, and the direction signal $S_{D2}$ is at the high level. Therefore, the counter circuit 113 stops adjusting the count value CV. In this case, the count value CV maintains at the value 2.

At the time point $T_5$, the voltage level of the system clock CLK is changed from the low level to the high level. At this time, each of the edge signal $S_{E2}$ and the direction signal $S_{D2}$ is at the high level. Therefore, the counter circuit 113 increases the count value CV from the value 2 to the value 3. At the time point $T_6$, the voltage level of the system clock CLK is re-changed from the low level to the high level. At this time, the edge signal $S_{E2}$ is at the low level, and the direction signal $S_{D2}$ is at the high level. Therefore, the counter circuit 113 stops adjusting the count value CV. In this case, the count value CV maintains at the value 3.

At the time points $T_7$ and $T_8$, the voltage level of the system clock CLK is re-changed from the low level to the high level. Each of the edge signal $S_{E2}$ and direction signal $S_{D2}$ is at the low level. Therefore, the counter circuit 113 stops adjusting the count value CV. In this case, the count value CV maintains at the value 3.

At the time point $T_9$, the voltage level of the system clock CLK is changed from the low level to the high level. At this time, the edge signal $S_{E2}$ is at the high level, and the direction signal $S_{D2}$ is at the low level. Therefore, the counter circuit 113 reduces the count value CV, such as from the value 3 to the value 2. At the time point $T_{10}$, the voltage level of the system clock CLK is re-changed from the low level to the high level. At this time, each of the edge signal $S_{E2}$ and the direction signal $S_{D2}$ is at the low level. Therefore, the counter circuit 113 stops adjusting the count value CV. In this case, the count value CV maintains at the value 2.

At the time point $T_{11}$, the voltage level of the system clock CLK is changed from the low level to the high level. At this time, the edge signal $S_{E2}$ is at the high level, and the direction signal $S_{D2}$ is at the low level. Therefore, the counter circuit 113 reduces the count value CV, such as from the value 2 to the value 1. At the time point $T_{12}$, the voltage level of the system clock CLK is re-changed from the low level to the high level. At this time, each of the edge signal $S_{E2}$ and the direction signal $S_{D2}$ is at the low level. Therefore, the counter circuit 113 stops adjusting the count value CV. In this case, the count value CV maintains at the value 1. At the time point $T_{13}$, the voltage level of the system clock CLK is changed from the low level to the high level. At this time, the edge signal $S_{E2}$ is at the high level, and the direction signal $S_{D2}$ is at the low level. Therefore, the counter circuit 113 reduces the count value CV, such as from the value 1 to the value 0.

Figure 6B:
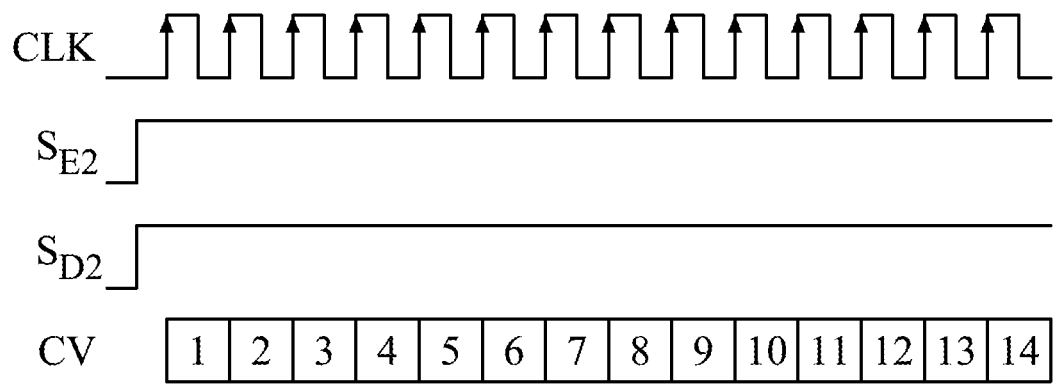
FIG. 6B is an operation schematic diagram of an exemplary embodiment of the control system entering a timer mode in accordance with some embodiments.

FIG. 6B is an operation schematic diagram of an exemplary embodiment of the control system entering a timer mode in accordance with some embodiments. When the timer signal $S_T$ is enabled, the control circuit 110 enters a timer mode. In the timer mode, the cutoff circuit 112 prevents the edge signal $S_{E1}$, and the direction signal $S_{D1}$ from entering the counter circuit 113. In one embodiment, the cutoff circuit 112 sets each of the edge signal $S_{E1}$, and the direction signal $S_{D1}$ at a high level. In such cases, each when the system clock CLK is changed from a low level to a high level, the counter circuit 113 adjusts the count value CV. When the count value CV reaches the target value (e.g., 14), the counter circuit 113 may send the interrupt signal FL.

Figure 7:
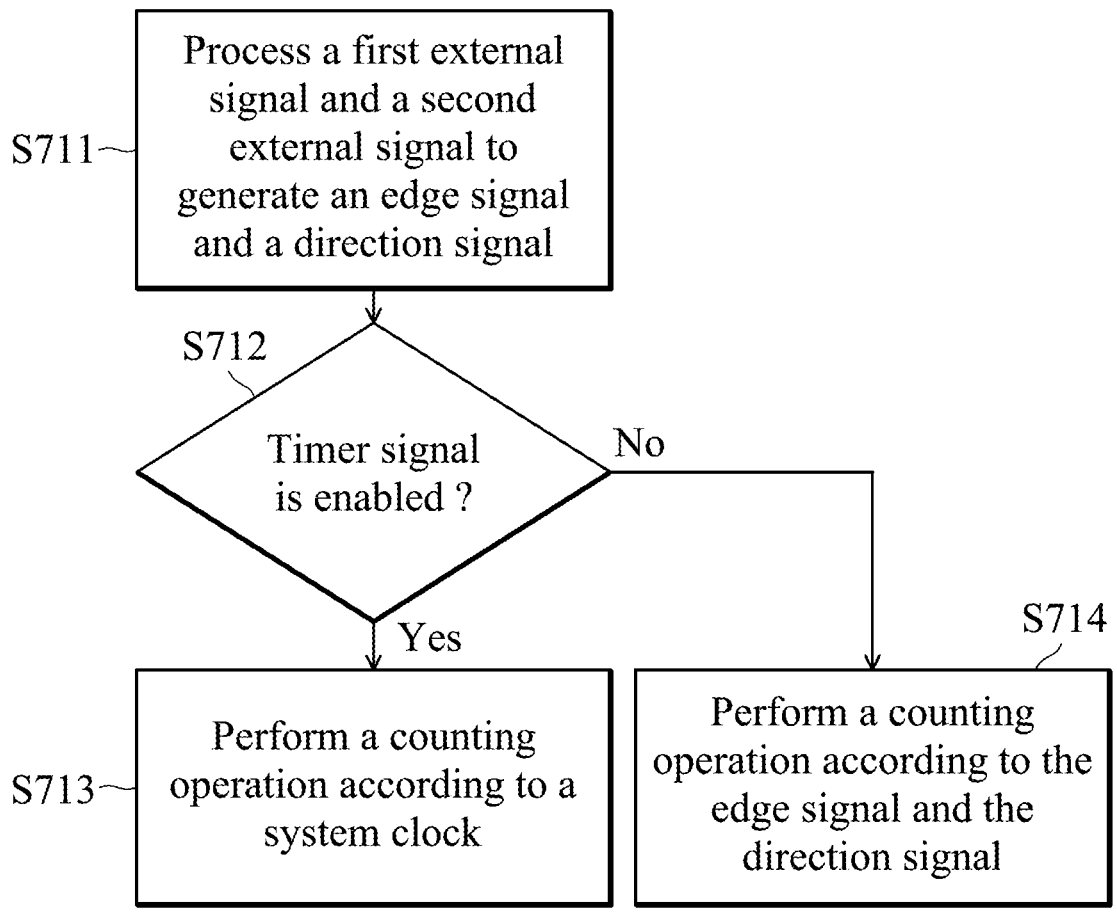
FIG. 7 is a flowchart of an exemplary embodiment of a control method in accordance with some embodiments.

FIG. 7 is a flowchart of an exemplary embodiment of a control method in accordance with some embodiments. The control method is applied in a MCU. First, a first external signal and a second external signal are processed to generate an edge signal and a direction signal (step S711). In one embodiment, if the definition of the voltage level defined by an external device which provides the first and second external signals is different from the definition of the voltage level defined by the MCU, the voltage levels of the first and second external signals are inverted in step S711. For example, assume that the external device defines that 3.3V is a high level and 0V is a low level, and the MCU defines that 0V is a high level and the 3.3V is a low level. In this case, the first and second external signals are inverted in step S711.

In other embodiments, if the first external signal provided by the external device contains edge information and the second external signal provided by the external device contains direction information, then the first external signal serves as an edge signal and the second external signal serves as a direction signal in step S711. However, if the first external signal provided by the external device contains direction information and the second external signal provided by the external device contains edge information, the second external signal serves as the edge signal and the first external signal serves as the direction signal in step S711.

Next, a determination is made as to whether a timer signal is enabled (step S712). In one embodiment, the voltage level of an input-output pin of the MCU is detected in step S712. When the voltage level of the input-output pin is equal to a specific level (e.g., a high level), it means that the timer signal is enabled. When the voltage level of the input-output pin is not equal to the specific level, it means that the timer signal is not enabled.

When the timer signal is enabled, a counting operation is performed according to a system clock (step S713). For example, when the system clock is changed from a first level to a second level, a count value is gradually increased in step S713. In one embodiment, the count value is gradually reduced in step S713. In other embodiments, when the system clock is changed from the second level to the first level, the count value is adjusted in step S713. When the count value arrives at the target value, an interrupt signal is sent to interrupt the operation of a CPU in step S713. In some embodiments, when the timer signal is enabled, each of the voltage levels of the edge signal and the direction signal is set to equal to the voltage level of the timer signal in step S713.

When the timer signal is not enabled, a counting operation is performed according to the edge signal and the direction signal (step S714). For example, when each of the voltage levels of the edge signal and the direction signal is equal to a specific level (e.g., a high level), a count value is increased in step S714. When the voltage level of the edge signal is equal to the specific level and the voltage level of the direction signal is not equal to the specific level, the count value is decreased in step S714. When the voltage levels of the edge signal and the direction signal are not equal to the specific level, the adjustment of the count value is stopped in step S714.

Since the MCU can adjust the count value according to external signals (e.g., QA and QB) or the system clock, the flexibility and efficiency of the MCU are increased.

It should be understood that when an element or layer is referred to as being "on", "connected to" or "coupled to" another element or layer, it can be directly on, connected or coupled to the other element or layer or intervening elements or layers may be present.

Control methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes a control circuit or a control system for practicing the methods. The control methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes a control circuit or a control system for practicing the disclosed methods. When implemented on a general-purpose processor, the program code combines with the processor to provide a unique apparatus that operates analogously to application-specific logic circuits.

Unless otherwise defined, all terms (including technical and scientific terms) used herein have the same meaning as commonly understood by one of ordinary skill in the art to which this invention belongs. It should be understood that terms, such as those defined in commonly used dictionaries, should be interpreted as having a meaning that is consistent with their meaning in the context of the relevant art and will not be interpreted in an idealized or overly formal sense unless expressly so defined herein. It should be understood that although the terms "first," "second," etc. may be used herein to describe various elements, these elements should not be limited by these terms. These terms are only used to distinguish one element from another.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A control circuit comprising:
    a quadrature encoder circuit generating a first edge signal and a first direction signal according to a first external signal and a second external signal;
    a counter circuit performing a counting operation according to the first edge signal and the first direction signal; and
    a first cutoff circuit,
    wherein in response to a timer signal being enabled, the first cutoff circuit prevents the first edge signal and the first direction signal from entering the counter circuit and the counter circuit performs the counting operation according to a system clock.

2. The control circuit as claimed in claim 1, wherein the first cutoff circuit is coupled between the quadrature encoder circuit and the counter circuit, and in response to the timer signal not being enabled, the first cutoff circuit provides the first edge signal and the first direction signal to the counter circuit so that the counter circuit performs the counting operation according to the first edge signal and the first direction signal.

3. The control circuit as claimed in claim 1, wherein in response to the timer signal being enabled, the first cutoff circuit provides a second edge signal and a second direction signal to the counter circuit and the second edge signal is the same as the second direction signal.

4. The control circuit as claimed in claim 3, wherein in response to the timer signal being enabled, the first cutoff circuit uses the timer signal as the second edge signal and the second direction signal.

5. The control circuit as claimed in claim 1, wherein:
in response to the timer signal not being enabled, the counter circuit detects a voltage level of the first edge signal and a voltage level of the first direction signal,
in response to the voltage levels of the first edge signal and the first direction signal being equal to a specific level, the counter circuit increases a count value,
in response to the voltage level of the first edge signal being equal to the specific level and the voltage level of the first direction signal not being equal to the specific level, the counter circuit decreases the count value, and
in response to the voltage levels of the first edge signal and the first direction signal not being equal to the specific level, the counter circuit stops adjusting the count value.

6. The control circuit as claimed in claim 3, wherein the first cutoff circuit comprises:
a first OR gate receiving the first edge signal and the timer signal, wherein in response to the timer signal being enabled, the first OR gate uses the timer signal as the second edge signal; and
a second OR gate receiving the first direction signal and the timer signal, wherein in response to the timer signal being enabled, the second OR gate uses the timer signal as the second direction signal.

7. The control circuit as claimed in claim 6, wherein in response to the timer signal not being enabled, the first OR gate uses the first edge signal as the second edge signal and the second OR gate uses the first direction signal as the second direction signal.

8. The control circuit as claimed in claim 6, further comprising:
a second cutoff circuit preventing the first and second external signals from entering the quadrature encoder circuit in response to the timer signal being enabled.

9. The control circuit as claimed in claim 1, wherein the quadrature encoder circuit comprises:
a processing circuit using the first external signal as a first output signal and using the second external signal as a second output signal or inverting the first and second external signals to generate a first inverted signal and a second inverted signal, using the first inverted signal as the first output signal, and using the second inverted signal as the second output signal;
a switching circuit using the first output signal as a third output signal and using the second output signal as a fourth output signal or using the first and second output signals as the fourth and third output signals;
an edge detector detecting edges of the third and fourth output signals to generate the first edge signal; and
a direction detector generating the first direction signal according to the third and fourth output signals.

10. The control circuit as claimed in claim 9, further comprising:
a second cutoff circuit coupled between the processing circuit and the switching circuit to prevent the first and second output signals from entering the switching circuit.

11. A control system controlling the operation of a motor and comprising:
a quadrature encoder circuit generating a first edge signal and a first direction signal according to a first external signal and a second external signal;
a counter circuit performing a counting operation according to the first edge signal and the first direction signal to adjust a count value;
a first cutoff circuit, wherein in response to a timer signal being enabled, the first cutoff circuit prevents the first edge signal and the first direction signal from entering the counter circuit and the counter circuit performs the counting operation according to a system clock; and
a central processing unit (CPU) coupled to the counter circuit,
wherein in response to the timer signal being enabled and the count value reaching a target value, the counter circuit sends an interrupt signal to interrupt the operation of the CPU.

12. The control system as claimed in claim 11, wherein the CPU operates according to the system clock, and in response to the timer signal being enabled, the counter circuit adjusts the count value according to the system clock.

13. The control system as claimed in claim 11, wherein in response to the timer signal not being enabled and the first edge signal and the first direction signal being abnormal, the counter circuit sends the interrupt signal so that the CPU interrupts the operation of the motor.

14. The control system as claimed in claim 11, wherein in response to the timer signal being enabled, the first cutoff circuit uses the timer signal as a second edge signal and a second direction signal and provides the second edge signal and the second direction signal to the counter circuit.

15. The control system as claimed in claim 11, wherein the first and second external signals are provided by the motor.

* * * * *